(12) United States Patent
Tsukiji

(10) Patent No.: US 6,429,072 B1
(45) Date of Patent: *Aug. 6, 2002

(54) METHOD OF FORMING A FLOATING GATE MEMORY CELL STRUCTURE

(75) Inventor: Masaru Tsukiji, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/332,109

(22) Filed: Jun. 14, 1999

(30) Foreign Application Priority Data

Jun. 12, 1998 (JP) ............................. 10-164944

(51) Int. Cl.[7] ............................. H01L 21/336
(52) U.S. Cl. ...................... 438/257; 257/321
(58) Field of Search ............... 257/316, 321; 438/257

(56) References Cited

U.S. PATENT DOCUMENTS

| | | | | |
|---|---|---|---|---|
| 4,788,581 A | * | 11/1988 | Knoll et al. | 257/428 |
| 5,763,913 A | * | 6/1998 | Jeong | 257/316 |
| 6,235,582 B1 | * | 5/2001 | Chen | 438/257 |

FOREIGN PATENT DOCUMENTS

| | | | |
|---|---|---|---|
| JP | A 7-106443 | 4/1995 | |
| JP | A 8-264664 | 10/1996 | |
| KR | 1998-015362 | 5/1998 | |

\* cited by examiner

*Primary Examiner*—Howard Weiss
(74) *Attorney, Agent, or Firm*—Young & Thompson

(57) ABSTRACT

The present invention provides a method of forming a floating gate memory cell structure. The method comprising the following steps. A dummy pattern is selectively formed on a predetermined region of a semiconductor substrate. Source and drain regions are selectively formed by use of a self-alignment technique using the dummy pattern as a mask. Conductive films are selectively formed on the source and drain regions so that the conductive films sandwich the dummy pattern in a lateral direction. The dummy pattern is removed so that a channel region defined between the source and drain regions is shown. A first single insulation film is unitary formed, which extends on the channel region and also on inside walls and top surfaces of the conductive films. A single floating gate electrode film is unitary formed on the first single insulation film, thereby laminating a single pair of the first single insulation film unitary formed and the single floating gate electrode film unitary formed. A second insulation film is formed, which extends on side walls and a top surface of the single floating gate electrode film. A control electrode is formed, which extends on the second insulation film so that the control electrode is separated by the second insulation film from the single floating gate electrode film.

10 Claims, 16 Drawing Sheets

METHOD OF FORMING A FLOATING GATE MEMORY CELL STRUCTURE

BACKGROUND OF THE INVENTION

The present invention relates to a method of forming a semiconductor memory cell structure having a floating gate.

A conventional structure of a flash memory will be described. FIG. 1A is a fragmentary plan view illustrative of a conventional flash memory. FIG. 1B is a fragmentary cross sectional elevation view illustrative of a conventional flash memory taken along an A—A' line of FIG. 1A. The flash memory has an alignment of memory cells 241 which has the following structure. A floating gate 203 is formed over a gate insulation film 202 over a semiconductor substrate 201. The floating gate 203 is T-shaped which comprises an upper portion and a lower portion, wherein the upper portion laterally extends from the opposite edges of a lower portion to form the T-shaped floating gate 203. The structure of the memory cell 241 will be described in detail with reference to FIG. 1B.

Field oxide films 206 are selectively formed on a semiconductor substrate 201 to define an active region or a device region of the semiconductor substrate 201. Source and drain regions 204 and 205 are selectively formed in the active region or the device region of the semiconductor substrate 201, whereby a channel region is defined between the source and drain regions 204 and 205. A gate insulation film 202 is formed on the channel region of the semiconductor substrate 201. Source side and drain side interconnections 204a and 205a are formed on the source and drain regions 204 and 205, wherein the source side and drain side interconnections 204a and 205a are made of polysilicon films doped with an impurity. In the memory cell 241, the source and drain 204 and 205 serve as parts of bit lines. The formation of the source side and drain side interconnections 204a and 205a on and in contact with the source and drain regions 204 and 205 results in reduction in resistance of the source and drain 204 and 205. A floating gate 203 is formed which comprises an lower part and an upper part. The upper part extends laterally from the opposite edges of the lower part so that the floating gate 203 is T-shaped. The lower part of the floating gate 203 is positioned on the gate insulation film 202. Side wall oxide films 213 are formed on opposite side walls of the lower part of the floating gate 203. Insulation films 216 are formed over the field oxide films 206 and the source side and drain side interconnections 204a and 205a as well as over the side wall oxide films 213. The upper portion of the floating gate 203 extends over the lower part thereof and the insulation films 216, so that opposite edges of the upper portion of the floating gate 203 are almost aligned to the edges of the source side and drain side interconnections 204a and 205a in plane view. An insulation film 207 made of ONO is formed on the upper portion of the floating gate 203 and on the insulation films 216. A control gate 208 is formed on the insulation film 207 so that the floating gate 203 is separated and electrically floated from the control gate 208 and whereby the floating gate 203 is completely surrounded by the insulation materials to be floated in the memory cell. The control gate 208 serves as a part of a word line in the memory. The above T-shape of the floating gate increases a capacitance thereof.

The source and drain 204 and 205 are commonly used for a plurality of the memory cells 241. The drain 05 is used as a part of the bit line so that a single bit contact is formed for the plural memory cells 241 so as to allow narrowing the distance between the memory cells, thereby reducing the cell size.

The following descriptions will focus onto the fabrication method of the above flash memory. FIGS. 2A through 2H are fragmentary cross sectional elevation views illustrative of a conventional method of forming a memory cell structure over a semiconductor substrate of a flash memory shown in FIGS. 1A and 1B.

With reference to FIG. 2A, a thin insulation film 202a is formed on a surface of a semiconductor substrate 201. A bottom floating gate part 203a is selectively formed on a predetermined region of the thin insulation film 202a, wherein a film of a electrode material such as an impurity doped polysilicon is entirely formed on the surface of the semiconductor substrate 201 before patterning the same to form the bottom floating gate part 203a. The bottom floating gate part 203a is used as a mask for carrying out an ion-implantation into selected upper regions of the semiconductor substrate 201, whereby source and drain regions 204 and 205 are formed with a self-alignment technique in the selected upper regions of the semiconductor substrate 201.

With reference to FIG. 2B, the thin insulation film 202a is removed except for its underlying part which underlies the bottom floating gate part 203a, whereby the remaining underlying part of the thin insulation film 202a serves as a gate insulation film 202. An insulation film is entirely formed on the source and drain regions 204 and 205 as well as on opposite side walls and a top surface of the bottom floating gate part 203a before an etch back process using a dry etching technique so that the insulation film remain only on the opposite side walls of the bottom floating gate part 203a, whereby the side wall insulation films 213 are formed on the opposite side walls of the bottom floating gate part 203a.

With reference to FIG. 2C, an impurity doped polysilicon film is entirely deposited over the source and drain regions 204 and 205 and the side wall insulation films 213 and the bottom floating gate part 203a. An etch back process is carried out to the impurity doped polysilicon film until the top of the bottom floating gate part 203a is shown, whereby conductive films 214 are formed on the source and drain regions 204 and 205 and positioned outside the side wall insulation films 213.

With reference to FIG. 2D, parts of the conductive films 214 on isolation regions are selectively removed. Grooves are further formed on the isolation region in the semiconductor substrate 201. An insulation material such as silicon oxide is buried within the grooves, whereby field oxide films 206 are then formed on the isolation regions. As a result, outside edges of the conductive films 214 are defined by inside boundaries of the field oxide films 206, whereby source side and drain side interconnections 204a and 205a are formed.

With reference to FIG. 2E, an insulation film 216 is entirely formed over the field oxide films 206, the source side and drain side interconnections 204a and 205a and the bottom floating gate part 203a.

With reference to FIG. 2F, an overlying part of the insulation film 216 overlying the bottom floating gate part 203a is selectively removed by patterning the insulation film 216 with use of a photo-lithography and a subsequent dry etching technique, whereby the top of the bottom floating gate part 203a is shown.

With reference to FIG. 2G, an impurity doped polysilicon film is entirely formed which extends over the insulation films 216 and the bottom floating gate part 203a. The impurity doped polysilicon film is then patterned with a photo-lithography and a subsequent dry etching technique, whereby a top floating gate part 203b is formed which extends over the top of the bottom floating gate part 203a and inside parts of the insulation films 216 so that opposite edges of the top floating gate part 203b are aligned to outside edges of the source side and drain side interconnections 204a and 205a. As a result, a combination of the top floating gate part 203b and the bottom floating gate part 203a forms a T-shaped floating gate 203.

With reference to FIG. 2H, an insulation film 207 made of ONO is formed on the top floating gate part 203b of the floating gate 203 and on the insulation films 216. A control gate 208 is then formed on the insulation film 207 so that the floating gate 203 is separated and electrically floated from the control gate 208 and whereby the floating gate 203 is completely surrounded by the insulation materials to be floated in the memory cell.

In accordance with the above conventional fabrication processes, the floating gate comprises two parts, for example, the top floating gate part 203b and the bottom floating gate part 203a which are formed in the different steps, whereby the number of the fabrication processes are increased.

In the above circumstances, it had been required to develop a novel method of fabricating a T-shaped floating gate electrode of a memory cell in a flash memory with reduced number of the fabrication process for the T-shaped floating gate electrode.

SUMMARY OF THE INVENTION

Accordingly, it is an object of the present invention to provide a novel method of fabricating a floating gate electrode of a memory cell in a flash memory with reduced number of the fabrication process for the T-shaped floating gate electrode.

It is another object of the present invention to provide a novel floating gate electrode of a memory cell in a flash memory.

The present invention provides a floating gate memory cell structure comprising: a single pair of a first single insulation film unitary formed and a single floating gate electrode film unitary formed and laminated on the first single insulation film, the first single insulation film extending on a channel region of a semiconductor substrate and also on inside walls and top surfaces of conductive films over source and drain regions in the semiconductor substrate; a second insulation film extending on side walls and a top surface of the single floating gate electrode film; and a control electrode extending on the second insulation film so that the control electrode is separated by the second insulation film from the single floating gate electrode film.

The present invention also provides a method of forming a floating gate memory cell structure. The method comprising the following steps. A dummy pattern is selectively formed on a predetermined region of a semiconductor substrate. Source and drain regions are selectively formed by use of a self-alignment technique using the dummy pattern as a mask. Conductive films are selectively formed on the source and drain regions so that the conductive films sandwich the dummy pattern in a lateral direction. The dummy pattern is removed so that a channel region defined between the source and drain regions is shown. A first single insulation film is unitary formed, which extends on the channel region and also on inside walls and top surfaces of the conductive films. A single floating gate electrode film is unitary formed on the first single insulation film, thereby laminating a single pair of the first single insulation film unitary formed and the single floating gate electrode film unitary formed. A second insulation film is formed, which extends on side walls and a top surface of the single floating gate electrode film. A control electrode is formed, which extends on the second insulation film so that the control electrode is separated by the second insulation film from the single floating gate electrode film.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DESCRIPTION OF THE PREFERRED EMBODIMENTS

Figure 1A:
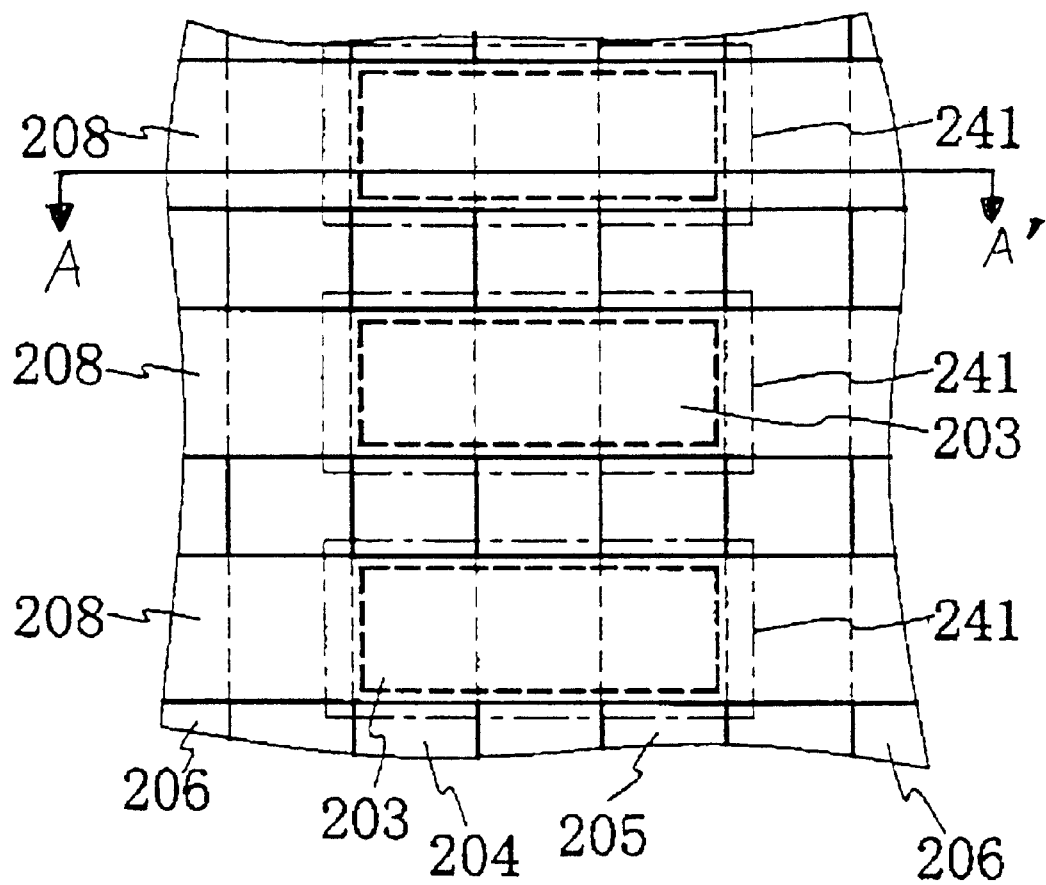
FIG. 1A is a fragmentary plan view illustrative of a conventional flash memory.

The first aspect of the present invention provides a floating gate electrode structure comprising: a single floating gate electrode film unitary formed and laminated on a first single insulation film being unitary formed and extending on a channel region of a semiconductor substrate and also on inside walls and top surfaces of conductive films over source and drain regions in the semiconductor substrate.

It is preferable that the first single insulation film has a thin portion and thick portions united with the thin portion, and the thin portion is positioned on the channel region and the thick portions are positioned on the inside walls and the top surfaces of the conductive films It is also preferable that the single floating gate electrode film has an almost uniform thickness.

The second aspect of the present invention provides a floating gate memory cell structure comprising: a single pair of a first single insulation film unitary formed and a single floating gate electrode film unitary formed and laminated on the first single insulation film, the first single insulation film extending on a channel region of a semiconductor substrate and also on inside walls and top surfaces of conductive films over source and drain regions in the semiconductor substrate; a second insulation film extending on side walls and a top surface of the single floating gate electrode film; and a control electrode extending on the second insulation film so that the control electrode is separated by the second insulation film from the single floating gate electrode film.

It is preferable that the first single insulation film has a thin portion and thick portions united with the thin portion, and the thin portion is positioned on the channel region and the thick portions are positioned on the inside walls and the top surfaces of the conductive films.

It is also preferable that the single floating gate electrode film has an almost uniform thickness.

The third aspect of the present invention provides a method of forming a floating gate memory cell structure. The method comprising the following steps. A dummy pattern is selectively formed on a predetermined region of a semiconductor substrate. Source and drain regions are selectively formed by use of a self-alignment technique using the dummy pattern as a mask. Conductive films are selectively formed on the source and drain regions so that the conductive films sandwich the dummy pattern in a lateral direction. The dummy pattern is removed so that a channel region defined between the source and drain regions is shown. A first single insulation film is unitary formed, which extends on the channel region and also on inside walls and top surfaces of the conductive films. A single floating gate electrode film is unitary formed on the first single insulation film, thereby laminating a single pair of the first single insulation film unitary formed and the single floating gate electrode film unitary formed.

It is preferable that the first single insulation film is made by a single dry oxidation process to both the channel region and the conductive films.

It is preferable to further comprise a silicon oxide thin film on the semiconductor substrate before the dummy pattern is selectively formed on the silicon oxide thin film, provided that the dummy pattern is made of silicon nitride.

The fourth aspect of the present invention provides a method of forming a floating gate memory cell structure. The method comprising the following steps. A dummy pattern is selectively formed on a predetermined region of a semiconductor substrate. Source and drain regions are selectively formed by use of a self-alignment technique using the dummy pattern as a mask. Conductive films are selectively formed on the source and drain regions so that the conductive films sandwich the dummy pattern in a lateral direction. The dummy pattern is removed so that a channel region defined between the source and drain regions is shown. A first single insulation film is unitary formed, which extends on the channel region and also on inside walls and top surfaces of the conductive films. A single floating gate electrode film is unitary formed on the first single insulation film, thereby laminating a single pair of the first single insulation film unitary formed and the single floating gate electrode film unitary formed. A second insulation film is formed, which extends on side walls and a top surface of the single floating gate electrode film. A control electrode is formed, which extends on the second insulation film so that the control electrode is separated by the second insulation film from the single floating gate electrode film.

It is preferable that the first single insulation film is made by a single dry oxidation process to both the channel region and the conductive films.

It is preferable to further comprise a silicon oxide thin film on the semiconductor substrate before the dummy pattern is selectively formed on the silicon oxide thin film, provided that the dummy pattern is made of silicon nitride.

Figure 1B:
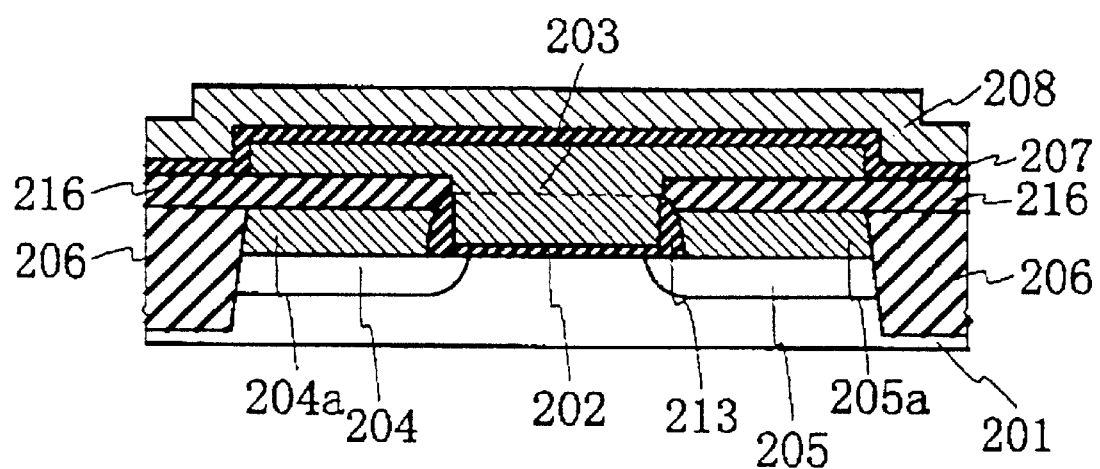
FIG. 1B is a fragmentary cross sectional elevation view illustrative of a conventional flash memory taken along an A—A' line of FIG. 1A.
Figure 2A:
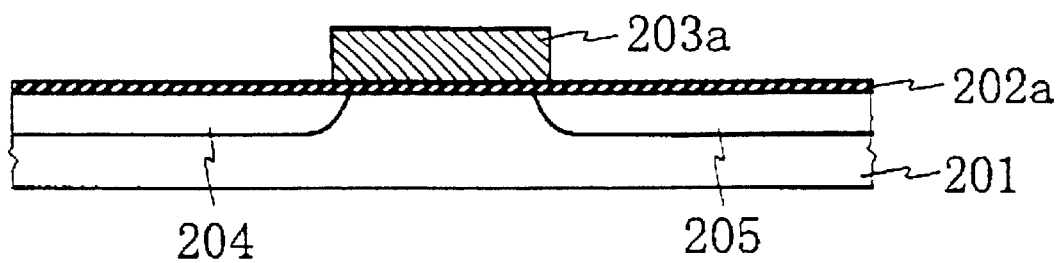
FIGS. 2A through 2H are fragmentary cross sectional elevation views illustrative of a conventional method of forming a memory cell structure over a semiconductor substrate of a flash memory shown in FIGS. 1A and 1B.
Figure 2B:
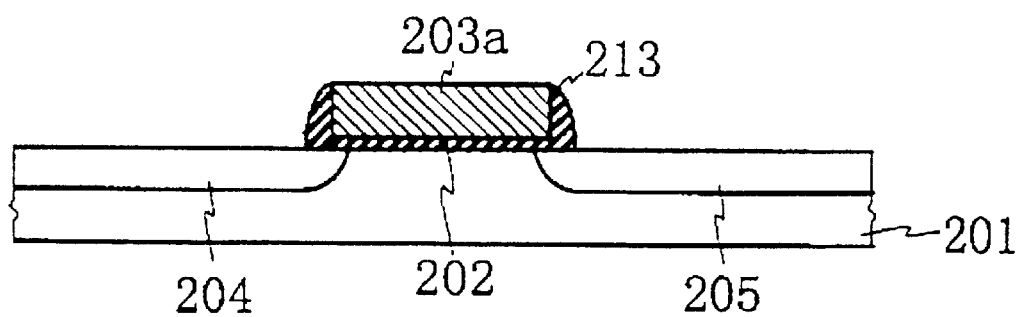
Figure 2C:
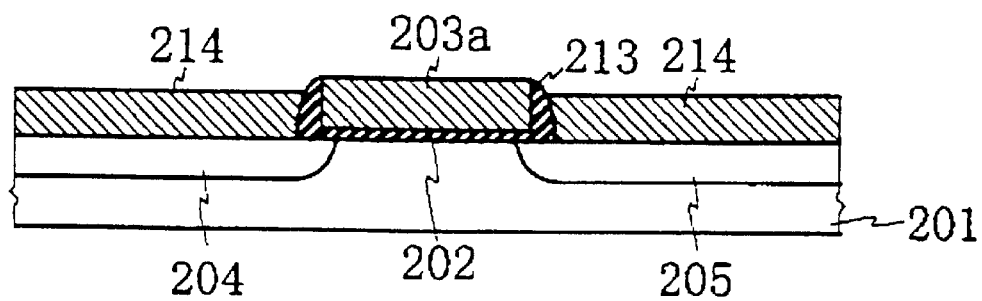
Figure 2D:
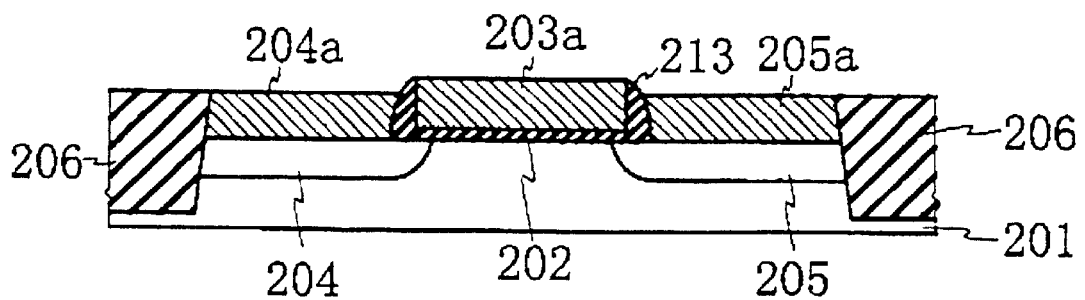
Figure 2E:
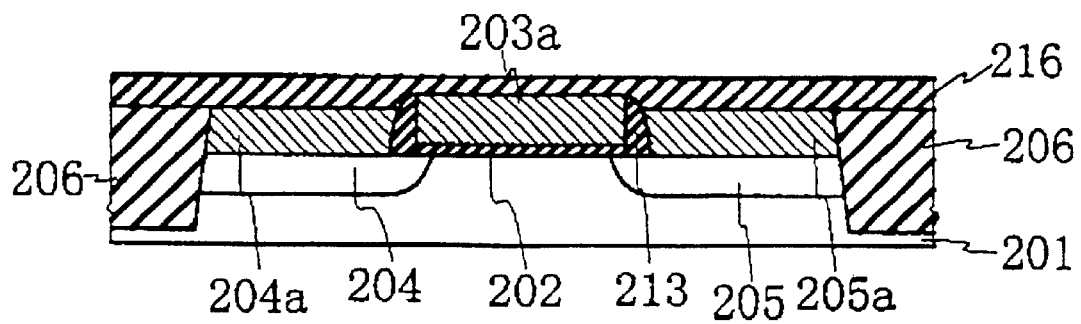
Figure 2F:
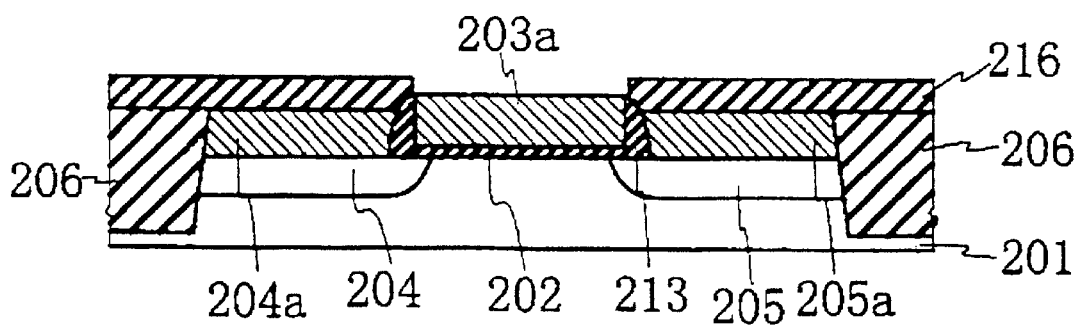
Figure 2G:
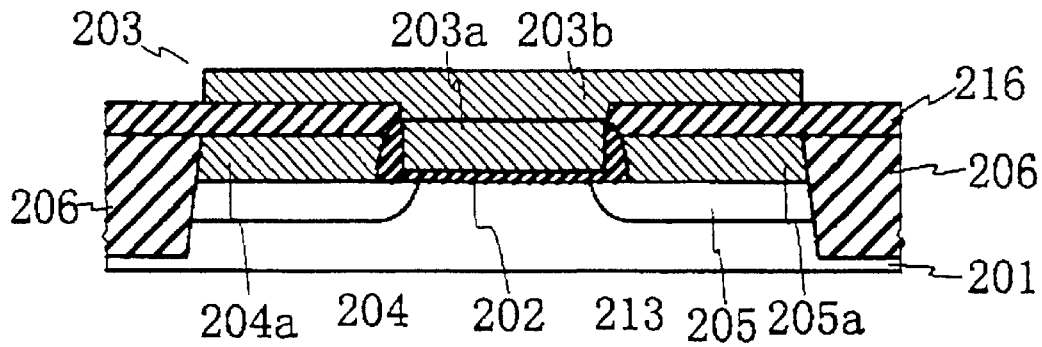
Figure 2H:
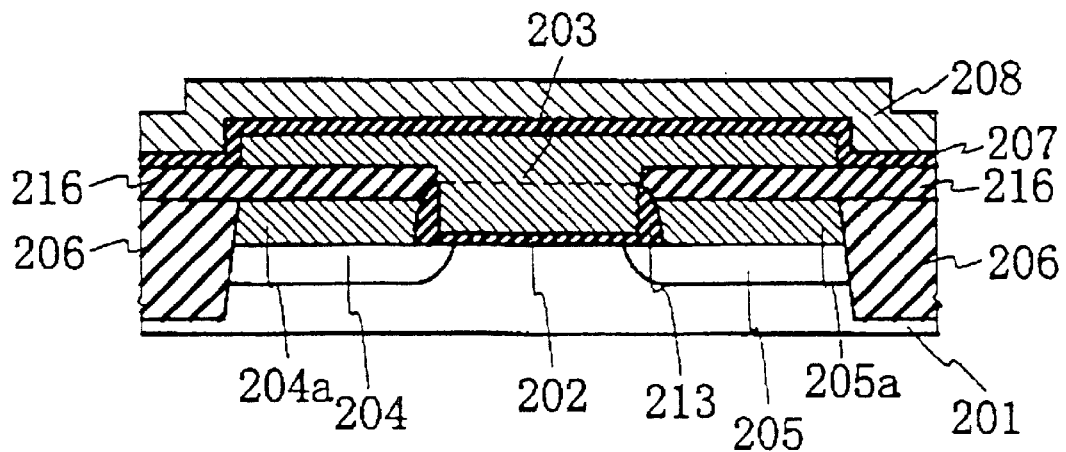
Figure 3A:
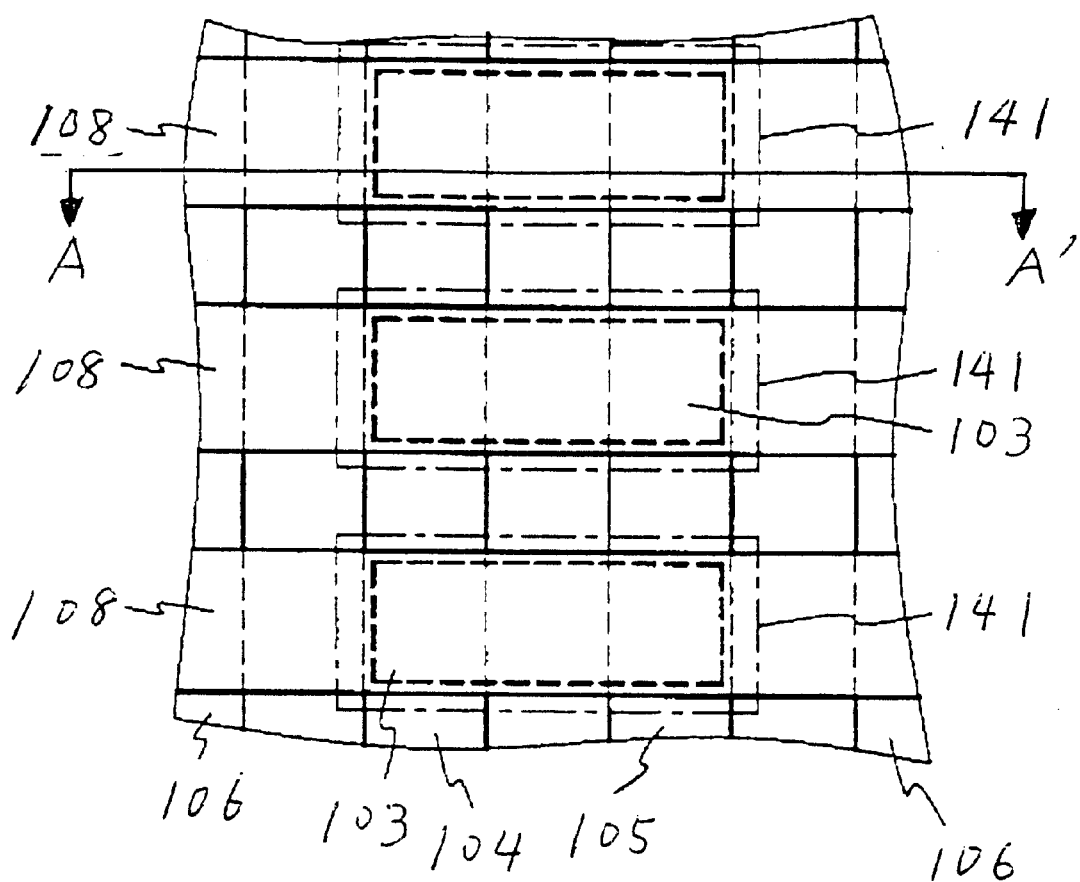
FIG. 3A is a fragmentary plan view illustrative of a flash memory in a first embodiment in accordance with the present invention.
Figure 3B:
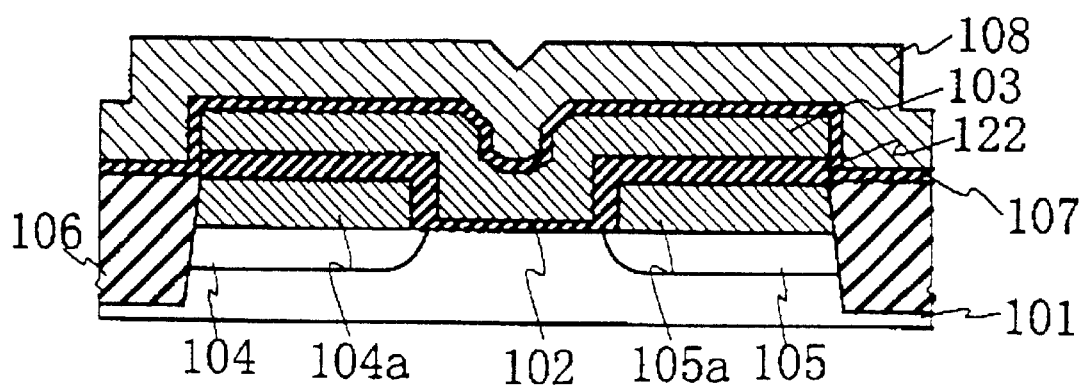
FIG. 3B is a fragmentary cross sectional elevation view illustrative of the flash memory taken along an A—A' line of FIG. 3A in a first embodiment in accordance with the present invention.

A first embodiment according to the present invention will be described in detail with reference to the drawings. The structure of the memory cell of the flash memory and the fabrication method thereof in the first embodiment in accordance with the present invention are different from the conventional ones shown FIGS. 1A and 1B as well as FIGS. 2A through 2H. FIG. 3A is a fragmentary plan view illustrative of the flash memory in a first embodiment in accordance with the present invention. FIG. 3B is a fragmentary cross sectional elevation view illustrative of the flash memory taken along an A—A' line of FIG. 3A in a first embodiment in accordance with the present invention. The flash memory has an alignment of memory cells 141 which has the following structure. A floating gate 103 is formed over a gate insulation film 102 over a semiconductor substrate 101. The floating gate 103 is T-shaped which comprises an upper portion and a lower portion, wherein the upper portion laterally extends from the opposite edges of a lower portion to form the T-shaped floating gate 103. The structure of the memory cell 141 will be described in detail with reference to FIG. 3B.

Field oxide films 106 are selectively formed on a semiconductor substrate 101 to define an active region or a device region of the semiconductor substrate 101. Source and drain regions 104 and 105 are selectively formed in the active region or the device region of the semiconductor substrate 101, whereby a channel region is defined between the source and drain regions 104 and 105. A gate insulation film 102 is formed on the channel region of the semiconductor substrate 101. Source side and drain side interconnections 104a and 105a are formed on the source and drain regions 104 and 105, wherein the source side and drain side interconnections 104a and 105a are made of polysilicon films doped with an impurity. In the memory cell 141, the source and drain 104 and 105 serve as parts of bit lines. The formation of the source side and drain side interconnections 104a and 105a on and in contact with the source and drain regions 104 and 105 results in reduction in resistance of the source and drain 104 and 105. A floating gate 103 is formed which laterally extending upper portions which extends over source and drain regions 104 and 105. The lower part of the floating gate 103 is positioned on the gate insulation film 102. Insulation films 122 are united with the gate insulation film 102, wherein the insulation films 122 extend on inside walls and top surfaces of the source side and drain side interconnections 104a and 105a. The laterally extending upper parts of the floating gate 103 extend over the insulation films 122, so that opposite edges of the laterally extending upper parts of the floating gate 103 are almost aligned to the edges of the source side and drain side interconnections 104a and 105a in plane view. An insulation film 107 made of ONO is formed on the floating gate 103. A control gate 108 is formed on the insulation film 107 so that the floating gate 103 is separated and electrically floated from the control gate 108 and whereby the floating gate 103 is completely surrounded by the insulation materials to be floated in the memory cell. The control gate 108 serves as a part of a word line in the memory.

The source and drain 104 and 105 are commonly used for a plurality of the memory cells 141. The drain 105 is used as a part of the bit line so that a single bit contact is formed for the plural memory cells 141 so as to allow narrowing the distance between the memory cells, thereby reducing the cell size.

The following descriptions will focus onto the novel fabrication method of the above flash memory. FIGS. 4A through 4H are fragmentary cross sectional elevation views illustrative of a novel method of forming a memory cell structure over a semiconductor substrate of a flash memory shown in FIGS. 3A and 3B.

Figure 4A:
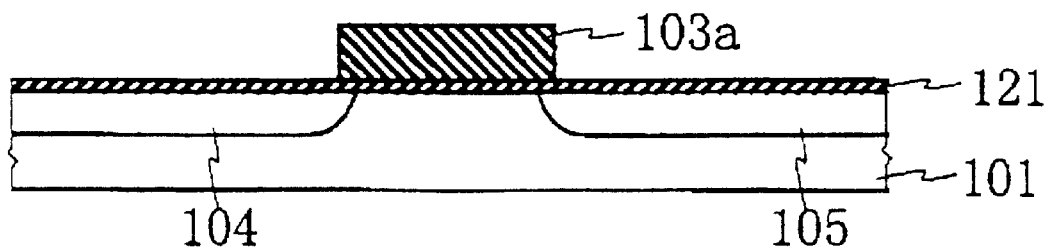
FIGS. 4A through 4H are fragmentary cross sectional elevation views illustrative of a novel method of forming a memory cell structure over a semiconductor substrate of a flash memory shown in FIGS. 3A and 3B.

With reference to FIG. 4A, a thin insulation film 121 is formed on a surface of a semiconductor substrate 101. A dummy pattern 103a is selectively formed on a predetermined region of the thin insulation film 121, wherein the thin insulation film 121 may be made of silicon oxide and the dummy pattern 103a may be made of silicon nitride. The dummy pattern 103a may be formed by forming a silicon nitride film and subsequent patterning the same with use of a photo-lithography and a subsequent dry etching process. The insulation film 121 made of silicon oxide absorbs a stress generated by forming the dummy pattern 103a made of silicon nitride. The dummy pattern 103a is used as a mask for carrying out an ion-implantation into selected upper regions of the semiconductor substrate 101, whereby source and drain regions 104 and 105 are formed with a self-alignment technique in the selected upper regions of the semiconductor substrate 101.

Figure 4B:
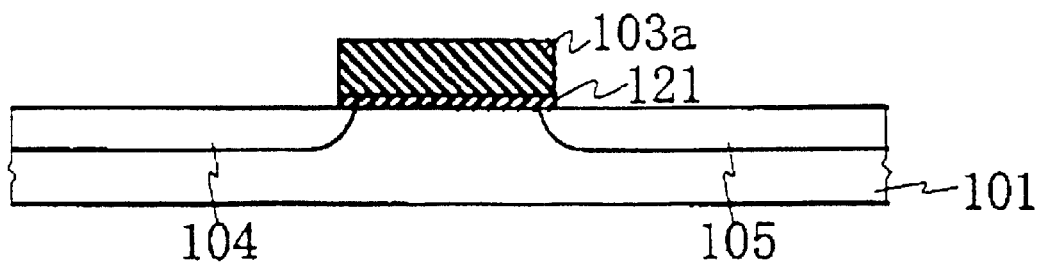

With reference to FIG. 4B, the thin insulation film 121 is removed except for its underlying part which underlies the dummy pattern 103a, whereby the remaining underlying part of the thin insulation film 121 serves as a gate insulation film 121.

Figure 4C:
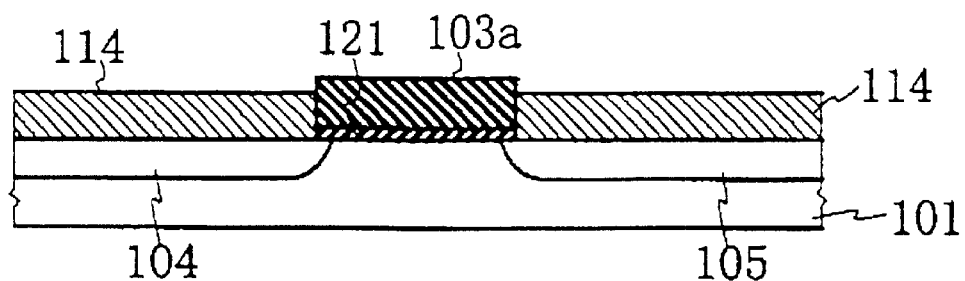

With reference to FIG. 4C, an impurity doped polysilicon film is entirely deposited over the source and drain regions 104 and 105 and the dummy pattern 103a. An etch back process is carried out to the impurity doped polysilicon film until the top of the dummy pattern 103a is shown, whereby conductive films 114 are formed on the source and drain regions 104 and 105 and positioned opposite side walls of the dummy pattern 103a.

Figure 4D:
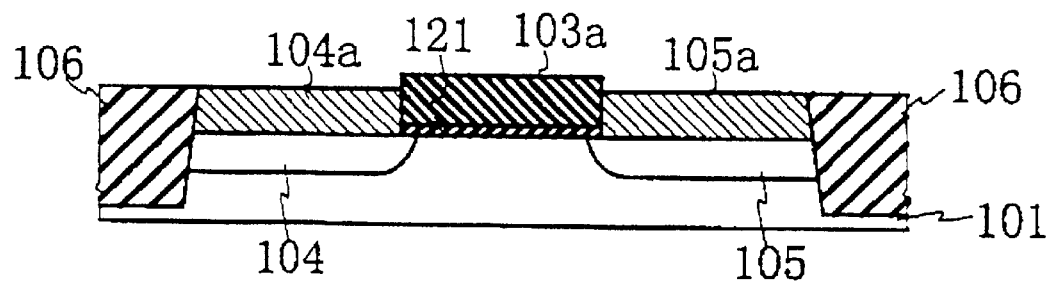

With reference to FIG. 4D, parts of the conductive films 114 on isolation regions are selectively removed. Grooves are further formed on the isolation region in the semiconductor substrate 101. An insulation material such as silicon oxide is buried within the grooves, whereby field oxide films 106 are then formed on the isolation regions. As a result, outside edges of the conductive films 114 as well as outside edges of the source and drain regions 104 and 105 are defined by inside boundaries of the field oxide films 106, whereby source side and drain side interconnections 104a and 105a are formed.

Figure 4E:
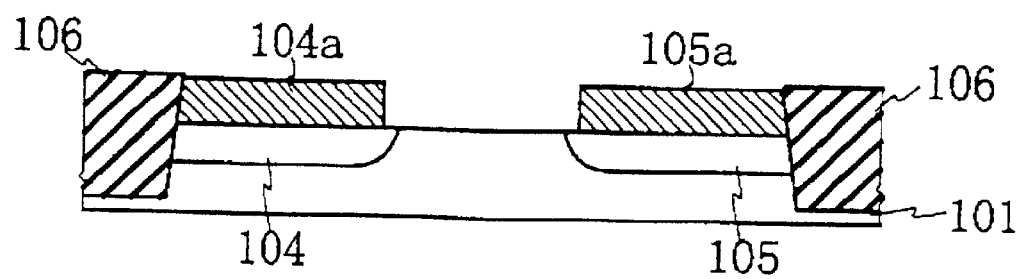

With reference to FIG. 4E, the dummy pattern 103a and the thin insulation film 121 are removed by selective wet etching processes. The dummy pattern 103a made of silicon nitride may be removed by a selective wet etching which uses a phosphoric acid solution as an etchant. The thin insulation film 121 made of silicon oxide may be removed by a subsequent selective wet etching which uses a hydrofluoric acid solution as an etchant. As a result, a top surface of the channel region of the semiconductor substrate 101 defined between the source and drain regions 104 and 105 is shown.

Figure 4F:
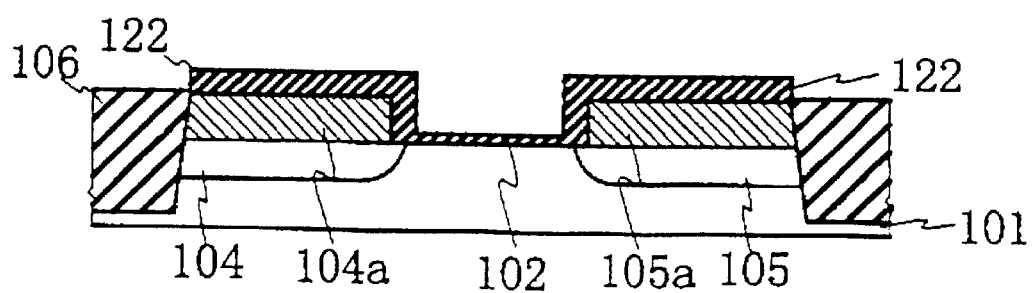

With reference to FIG. 4F, a dry oxidation process is carried out at a temperature of about 850° C. in a dry oxygen atmosphere, thereby concurrently forming a gate oxide film 102 on the top surface of the channel region of the semiconductor substrate 101 and also forming inter-layer insulators 122 on side walls and top surfaces of the source side and drain side interconnections 104a and 105a. Since the channel region is made is a single crystal silicon whilst the source side and drain side interconnections 104a and 105a are made of polysilicon, the same dry oxidation process results in formation of the thicker inter-layer insulators 122 by three or four times than the gate insulation film 102.

Figure 4G:
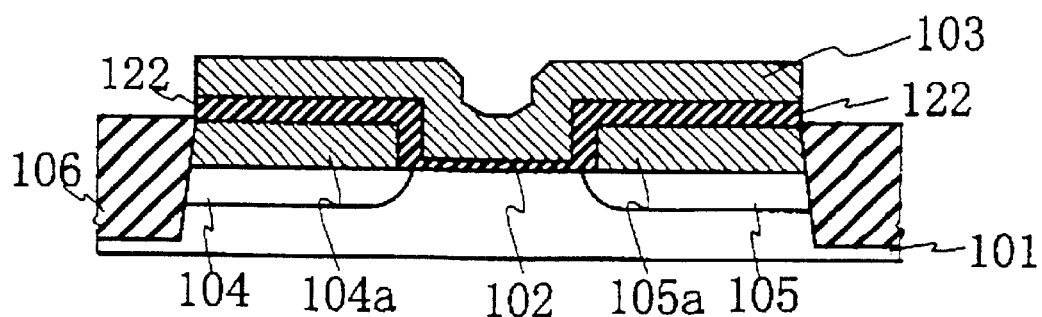

With reference to FIG. 4G, an impurity doped polysilicon film is entirely formed which extends over the inter-layer insulators 122 and the gate insulation film 102 as well as over the field oxide films 106. The impurity doped polysilicon film is then patterned with a photo-lithography and a subsequent dry etching technique, whereby a floating gate electrode 103 is formed in a single pair of the film deposition and subsequent patterning processes, wherein opposite side edges of the floating gate electrode 103 are aligned to he opposite side edges of the inter-layer insulators 122. This single pair of the deposition and subsequent patterning processes for the floating gate electrode 103 reduces the number of the fabrication processes.

Figure 4H:
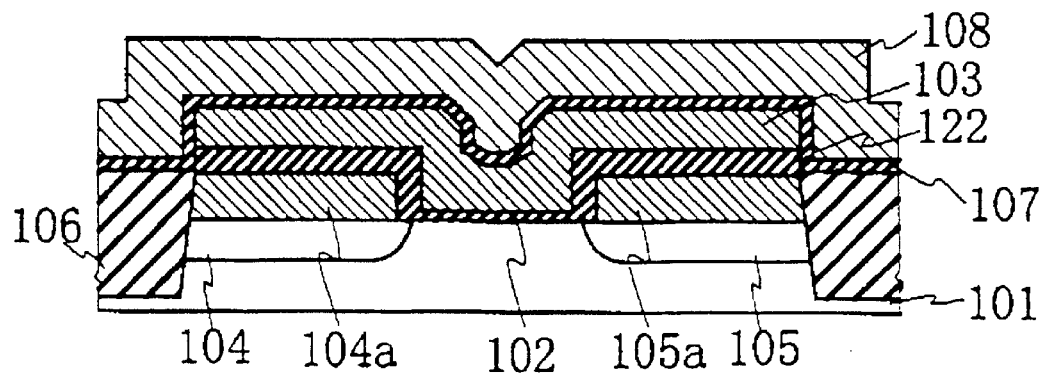

With reference to FIG. 4H, an insulation film 107 made of ONO is formed on the floating gate 103 and on the insulation films 106. A control gate 108 is then formed on the insulation film 107 so that the floating gate 103 is separated and electrically floated from the control gate 108 and whereby the floating gate 103 is completely surrounded by the insulation materials to be floated in the memory cell.

In accordance with the above novel fabrication processes, the floating gate comprises a single part which has laterally extending upper parts overlying the interconnections 104a and 105a over the source and drain regions 104 and 105. The floating gate is formed by the single pair of the film deposition and subsequent patterning processes, whereby the number of the fabrication processes is reduced.

A second embodiment according to the present invention will be described in detail with reference to the drawings. A difference of the second embodiment from the first embodiment is only in the fabrication processes, for which reason the descriptions to the structure of the memory cell of this embodiment will be omitted. FIGS. 5A through 5H are fragmentary cross sectional elevation views illustrative of another novel method of forming a memory cell structure over a semiconductor substrate of a flash memory shown in FIGS. 3A and 3B.

Figure 5A:
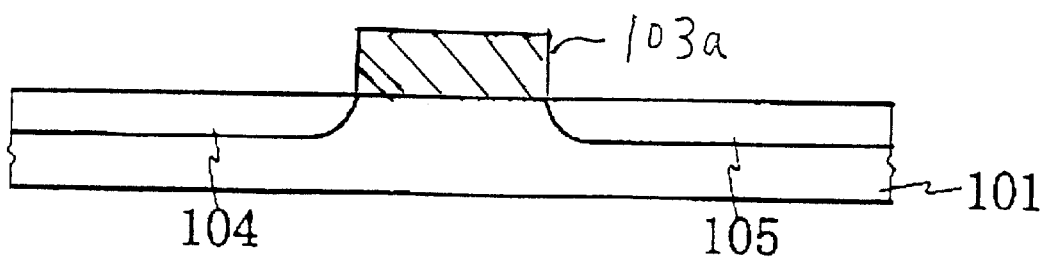
FIGS. 5A through 5G are fragmentary cross sectional elevation views illustrative of another novel method of forming a memory cell structure over a semiconductor substrate of a f lash memory shown in FIGS. 3A and 3B in a fourth embodiment in accordance with the present invention.

With reference to FIG. 5A, A dummy pattern 103a is selectively formed on a predetermined region of a semiconductor substrate 101, wherein the dummy pattern 103a may be made of silicon oxide. The dummy pattern 103a may be formed by forming a silicon oxide film and subsequent patterning the same with use of a photo-lithography and a subsequent dry etching process. The dummy pattern 103a is used as a mask for carrying out an ion-implantation into selected upper regions of the semiconductor substrate 101, whereby source and drain regions 104 and 105 are formed with a self-alignment technique in the selected upper regions of the semiconductor substrate 101.

Figure 5B:
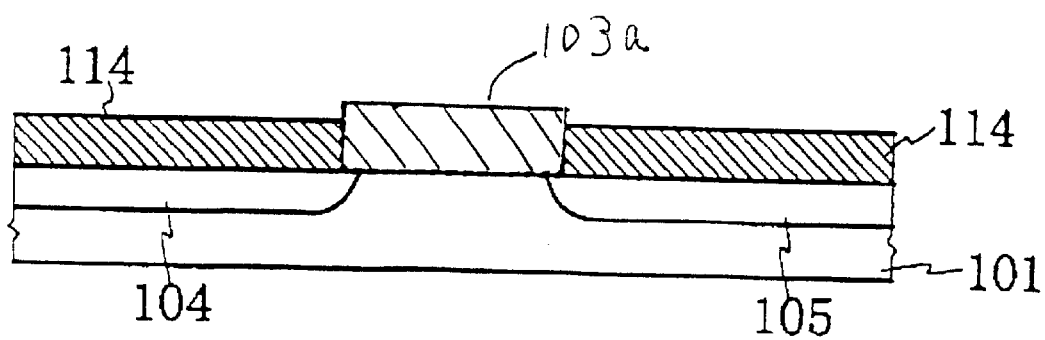

With reference to FIG. 5B, an impurity doped polysilicon film is entirely deposited over the source and drain regions 104 and 105 and the dummy pattern 103a. An etch back process is carried out to the impurity doped polysilicon film until the top of the dummy pattern 103a is shown, whereby conductive films 114 are formed on the source and drain regions 104 and 105 and positioned opposite side walls of the dummy pattern 103a.

Figure 5C:
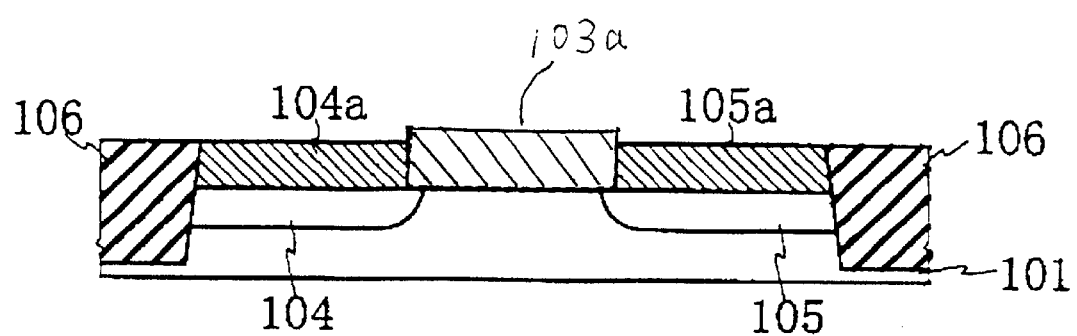

With reference to FIG. 5C, parts of the conductive films 114 on isolation regions are selectively removed. Grooves are further formed on the isolation region in the semiconductor substrate 101. An insulation material such as silicon oxide is buried within the grooves, whereby field oxide films 106 are then formed on the isolation regions. As a result, outside edges of the conductive films 114 as well as outside edges of the source and drain regions 104 and 105 are defined by inside boundaries of the field oxide films 106, whereby source side and drain side interconnections 104a and 105a are formed.

Figure 5D:
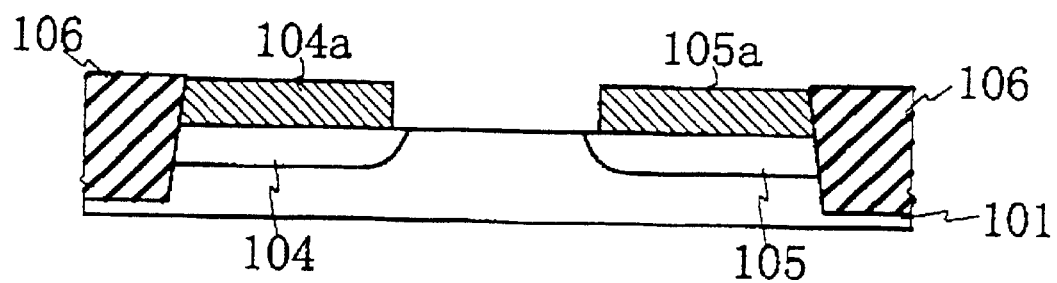

With reference to FIG. 5D, the dummy pattern 103a is removed by a selective wet etching process. The dummy pattern 103a made of silicon oxide may be removed by a selective wet etching which uses a hydrofluoric acid solution as an etchant. As a result, a top surface of the channel region of the semiconductor substrate 101 defined between the source and drain regions 104 and 105 is shown.

Figure 5E:
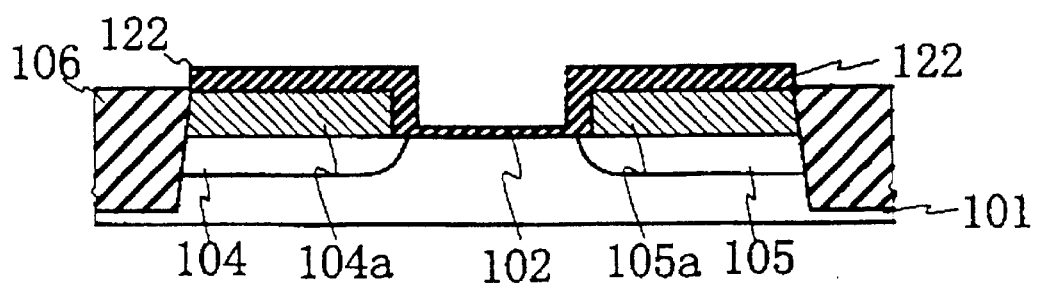

With reference to FIG. 5E, a dry oxidation process is carried out at a temperature of about 850° C. in a dry oxygen atmosphere, thereby concurrently forming a gate oxide film 102 on the top surface of the channel region of the semiconductor substrate 101 and also forming inter-layer insulators 122 on side walls and top surfaces of the source side and drain side interconnections 104a and 105a. Since the channel region is made is a single crystal silicon whilst the source side and drain side interconnections 104a and 105a are made of polysilicon, the same dry oxidation process results in formation of the thicker inter-layer insulators 122 by three or four times than the gate insulation film 102.

Figure 5F:
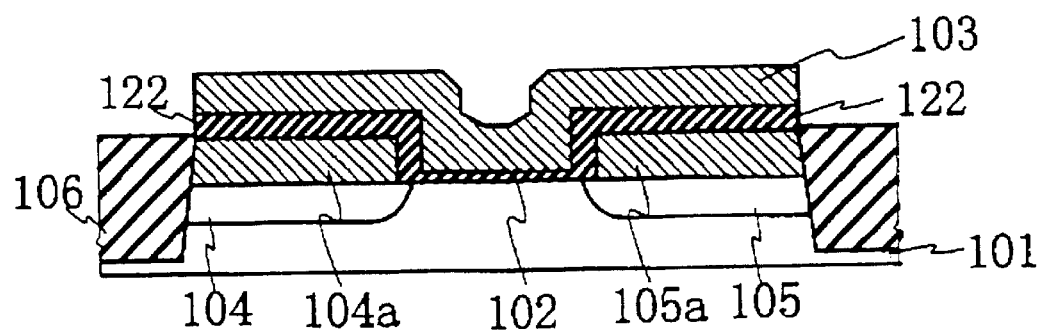

With reference to FIG. 5F, an impurity doped polysilicon film is entirely formed which extends over the inter-layer insulators 122 and the gate insulation film 102 as well as over the field oxide films 106. The impurity doped polysilicon film is then patterned with a photo-lithography and a subsequent dry etching technique, whereby a floating gate electrode 103 is formed in a single pair of the film deposition and subsequent patterning processes, wherein opposite side edges of the floating gate electrode 103 are aligned to he opposite side edges of the inter-layer insulators 122. This single pair of the deposition and subsequent patterning processes for the floating gate electrode 103 reduces the number of the fabrication processes.

Figure 5G:
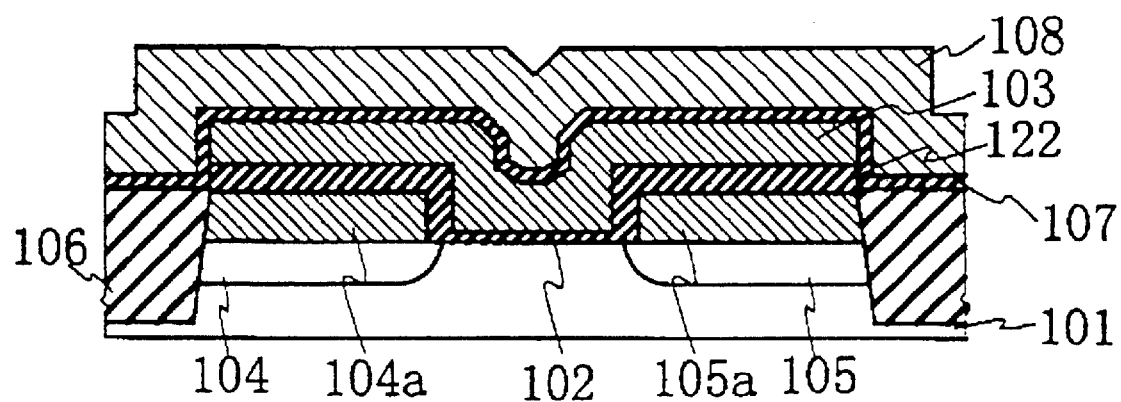

With reference to FIG. 5G, an insulation film 107 made of ONO is formed on the floating gate 103 and on the insulation films 106. A control gate 108 is then formed on the insulation film 107 so that the floating gate 103 is separated and electrically floated from the control gate 108 and whereby the floating gate 103 is completely surrounded by the insulation materials to be floated in the memory cell.

In accordance with the above novel fabrication processes, the floating gate comprises a single part which has laterally extending upper parts overlying the interconnections 104a and 105a over the source and drain regions 104 and 105. The floating gate is formed by the single pair of the film deposition and subsequent patterning processes, whereby the number of the fabrication processes is reduced.

As a modification to the foregoing embodiments of the present invention, the dummy pattern may be made of other materials than silicon nitride and silicon oxide, provided that the dummy pattern material should be selected to have such an etching selectivity that an etching rate of the dummy pattern is higher than that of the interconnections 104a and 105a over the source and drain regions 104 and 105.

Etch back process for forming the conductive films 114 may be carried out by a chemical mechanical polishing method. In this case, the dummy pattern 103a may preferably be made of silicon nitride so that the dummy pattern 103a may serve as an etching stopper to the chemical mechanical polishing.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of forming a floating gate electrode structure, said method comprising the steps of:

selectively forming a dummy pattern on a predetermined region of a semiconductor substrate;

selectively forming source and drain regions by use of a self-alignment technique using said dummy pattern as a mask;

selectively forming conductive films on said source and drain regions so that said conductive films sandwich said dummy pattern in a lateral direction;

removing said dummy pattern to expose a channel region defined in said substrate between said source and drain regions;

unitarily forming a first single insulation film directly on said channel region and also on said conductive films; and unitarily forming a single floating gate electrode film on said single insulation film, thereby laminating a single pair of said first single insulation film unitarily formed and said single floating gate electrode film unitarily formed.

2. The method as claimed in claim 1, wherein said first single insulation film is made by a single dry oxidation process to both said channel region and said conductive films.

3. The method as claimed in claim 1, further comprising the steps of forming a silicon oxide thin film on said semiconductor substrate before said dummy pattern is selectively formed on said silicon oxide thin film, and forming said dummy pattern of silicon nitride.

4. A method of forming a floating gate memory cell structure, said method comprising the steps of:

selectively forming a dummy pattern on a predetermined region of a semiconductor substrate;

selectively forming source and drain regions by use of a self-alignment technique using said dummy pattern as a mask;

selectively forming conductive films on said source and drain regions so that said conductive films sandwich said dummy pattern in a lateral direction;

removing said dummy pattern to expose a channel region defined in said substrate between said source and drain regions;

unitarily forming a first single insulation film directly on said channel region and also on said conductive films;

unitarily forming a single floating gate electrode film on said first single insulation film, thereby laminating a single pair of said first single insulation film unitarily formed and said single floating gate electrode film unitarily formed;

forming a second insulation film extending on side walls and a top surface of said single floating gate electrode film; and forming a control electrode extending on said second insulation film so that said control electrode is separated by said second insulation film from said single floating gate electrode film.

5. The method as claimed in claim 4, wherein said first single insulation film is made by a single dry oxidation process to both said channel region and said conductive films.

6. The method as claimed in claim 4, further comprising the steps of forming a silicon oxide thin film on said semiconductor substrate before said dummy pattern is selectively formed on said silicon oxide thin film, and forming said dummy pattern of silicon nitride.

7. The method of claim 1, wherein said first single insulation film has a generally uniform thickness.

8. The method of claim 4, wherein said first single insulation film has a generally uniform thickness.

9. The method of claim 1, wherein said dummy pattern is completely removed from the channel region during the removing step.

10. The method of claim 4, wherein said dummy pattern is completely removed from the channel region during the removing step.

* * * * *